United States Patent
Aronowitz et al.

(10) Patent No.: US 7,132,336 B1
(45) Date of Patent: Nov. 7, 2006

(54) METHOD AND APPARATUS FOR FORMING A MEMORY STRUCTURE HAVING AN ELECTRON AFFINITY REGION

(75) Inventors: Sheldon Aronowitz, San Jose, CA (US); Vladimir Zubkov, Mountain View, CA (US); Grace S. Sun, Mountain View, CA (US)

(73) Assignee: LSI Logic Corporation, Milpitas, CA (US)

( * ) Notice: Subject to any disclaimer, the term of this patent is extended or adjusted under 35 U.S.C. 154(b) by 63 days.

(21) Appl. No.: 10/123,263

(22) Filed: Apr. 15, 2002

Related U.S. Application Data

(60) Provisional application No. 60/357,202, filed on Feb. 12, 2002.

(51) Int. Cl.
*H01L 21/336* (2006.01)
(52) U.S. Cl. ............... 438/288; 438/216; 438/287; 257/E29.309; 257/E21.18; 257/E21.679
(58) Field of Classification Search .......... 438/288, 438/917, 216, 287, 218, FOR. 202; 257/E29.309, 257/E21.18, E21.423, E21.679
See application file for complete search history.

(56) References Cited

U.S. PATENT DOCUMENTS

| | | | |
|---|---|---|---|
| 3,945,031 A | * | 3/1976 | Kahng et al. ............... 257/325 |
| 4,162,176 A | * | 7/1979 | Tsuda ......................... 438/257 |
| 4,217,601 A | * | 8/1980 | DeKeersmaecker et al. ............... 257/325 |
| 4,297,782 A | * | 11/1981 | Ito ........................... 438/275 |
| 6,445,030 B1 | | 9/2002 | Wu et al. |
| 6,528,374 B1 | | 3/2003 | Bojarczuk, Jr. et al. |
| 6,541,280 B1 | | 4/2003 | Kaushik et al. |
| 6,576,967 B1 | | 6/2003 | Schaeffer et al. |
| 6,800,519 B1 | | 10/2004 | Muraoka et al. |
| 2001/0038135 A1 | * | 11/2001 | Forbes et al. ............... 257/405 |
| 2003/0104666 A1 | | 6/2003 | Bojarczuk et al. |
| 2004/0084736 A1 | | 5/2004 | Harada |
| 2004/0185627 A1 | | 9/2004 | Brask et al. |

OTHER PUBLICATIONS

Wolf et al., Silicon Processing for the VLSI Era, vol. 1: Process Technology, 1986 by Lattice Press, pp. 303-306.*

* cited by examiner

*Primary Examiner*—George Fourson
*Assistant Examiner*—Julio J. Maldonado
(74) *Attorney, Agent, or Firm*—Beyer, Weaver & Thomas

(57) ABSTRACT

An improved semiconductor memory structure and methods for its fabrication are disclosed. The memory structure includes a semiconductor substrate having a dielectric region formed over a channel region. A doped region is formed between a top portion and a bottom portion of the dielectric region. This doped region includes a suitable electron affinity material. A gate electrode is connected with the top of the dielectric region. In some embodiments, suitable electron affinity materials are introduced into the doped region using implantation techniques. In another embodiment, the electron affinity material is introduced into the doped region using plasma treatment of the dielectric region and the redeposition of additional dielectric material on top of the dielectric region and doped region.

15 Claims, 5 Drawing Sheets

METHOD AND APPARATUS FOR FORMING A MEMORY STRUCTURE HAVING AN ELECTRON AFFINITY REGION

CROSS-REFERENCE TO RELATED APPLICATIONS

This application claims priority of U.S. provisional patent application No. 60/357,202, filed Feb. 12, 2002, entitled "New Method Of Creating A Semiconductor Memory Device", which is hereby incorporated by reference.

TECHNICAL FIELD

The invention described herein relates generally to semiconductor memory devices and the methods of their manufacture. In particular, the invention relates to methods and structures for creating memory devices having a doped electron affinity region.

BACKGROUND

One type of semiconductor memory device uses two different dielectric materials forming layers in the channel region of the device to form a charge storage center. The interface between the two different dielectric materials forms an electron trapping region that creates the charge storage center. Such devices are often referred to as MIOS (metal insulator oxide semiconductor) devices. Where the insulator material is silicon nitride such devices are commonly referred to as MNOS devices. Such devices and their properties are well known in the art (e.g., see S. M. Sze, Physics of Semiconductor Devices (John Wiley & Sons, New York, $2^{nd}$ Ed., 1981) Section 8.6.2).

One example of a conventional prior art MIOS memory device is described hereinbelow. In FIG. 1 a portion of typical MIOS memory cell 10 is depicted. A semiconductor substrate 100 (e.g., a p-doped silicon wafer) includes a "channel" region 101 positioned between a source 102 and a drain 103 (e.g., n-doped regions). A first dielectric layer 104 (e.g., silicon dioxide) is formed on the substrate surface. Commonly polysilicon electrodes 105, 106 are formed on the first dielectric layer 104. A second layer of dielectric material 107 is formed over the first dielectric layer 104 and portions of the polysilicon electrodes 105, 106 in the channel region 101. A gate electrode 108 is formed over the second dielectric layer 107. In the interests of simplifying the discussion, the remaining portions of the memory cell 10 are not depicted.

In MIOS memory cells, the first dielectric layer 104 is formed of a different material than the second dielectric layer 107. For example, the first dielectric layer 104 can be formed of silicon dioxide and the second dielectric layer 107 can be formed of another dielectric material, for example, silicon oxynitride. The interfacial region between the first dielectric layer 104 and the second dielectric layer 107 creates an interfacial charge storage layer 109 which can, among other things, be used to alter the amount of voltage required to change the memory state of the cell. Such devices are relatively small, resistant to ionizing radiation, and can alter the write and erase times (and voltages).

However, such memory structures also suffer from some drawbacks. One drawback is that the interfacial charge storage layer 109 between the first dielectric layer 104 and the second dielectric layer 107 is difficult to form reproducibly and reliably. Additionally, interfacial charge storage layers 109 formed in this manner suffer from unpredictable electron bonding strength, further adding to their unpredictability and reliability problems. This inability to reliably and reproducibly fabricate interfacial charge storage layers leads to unpredictable behavior in such memory structures. Additionally, it is difficult to vary the amount of charge stored by the interfacial charge storage layer 109 or to alter the strength of an electron trapping environment. Thus, such devices are not particularly flexible in their application. Moreover, as feature sizes decrease these problems become aggravated and also more difficult to solve. These problems become particularly intractable as feature sizes decrease below the 0.1 micron (μ) level.

Although suitable for many purposes, conventional MIOS and MNOS memory structures suffer from many difficulties. The principles of the present invention are directed toward improved memory structures and improved methodologies for constructing such memory structures.

SUMMARY OF THE INVENTION

In accordance with the principles of the present invention, the invention includes structure and method for forming improved semiconductor memory structures. One embodiment uses a specially prepared (doped) dielectric region formed over a channel region of a semiconductor substrate. The dielectric region has a top portion and a bottom portion. A doped region is formed between the top portion of the dielectric region and the bottom portion of the dielectric region. This doped region is doped with an electron affinity material. A gate electrode is connected with the top of the dielectric region. In various embodiments the electron affinity materials are introduced into the doped region using implantation or plasma treatment techniques.

The invention includes a method embodiment for forming a memory device. The method includes providing a suitable semiconductor substrate and forming a dielectric region over a channel region of the substrate. A doped region is formed between the top and bottom portions of the dielectric region and a gate electrode is connected with the top portion of the dielectric region. In a related embodiment, the doped region is formed by implanting the dielectric region with a suitable electron affinity material to form the doped region between the top portion of the dielectric region and the bottom portion of the dielectric region.

In a related embodiment, the doped region is formed by plasma treating the dielectric region with a suitable electron affinity material to form the doped region in the top portion of the dielectric region. This is followed by removing a top portion of the dielectric region. Subsequently, another dielectric region is formed over the remaining dielectric region. A gate electrode is then formed and connected to the top of the dielectric region.

Further embodiments can include dielectric regions having more than one dielectric layer. Moreover, in some embodiments the various dielectric layers can be comprised of different dielectric materials.

These and other aspects of the invention will be disclosed in greater detail in the following detailed description.

BRIEF DESCRIPTION OF THE DRAWINGS

The following detailed description will be more readily understood in conjunction with the accompanying drawings, in which.

It is to be understood that in the drawings like reference numerals designate like structural elements. Also, it is understood that the depictions in the drawings are not necessarily to scale.

DETAILED DESCRIPTION OF THE DRAWINGS

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

Embodiments of the present invention are directed to memory structures having a doped region and the methods of forming such memory structures. In such structures the doped region is defined as region of the dielectric layer having been doped with suitable electron affinity materials, thereby forming a "trapping region" which can trap electrons and function as a charge storage center. Detailed descriptions and definitions of the foregoing concepts and materials will be described hereinbelow.

Figure 1:
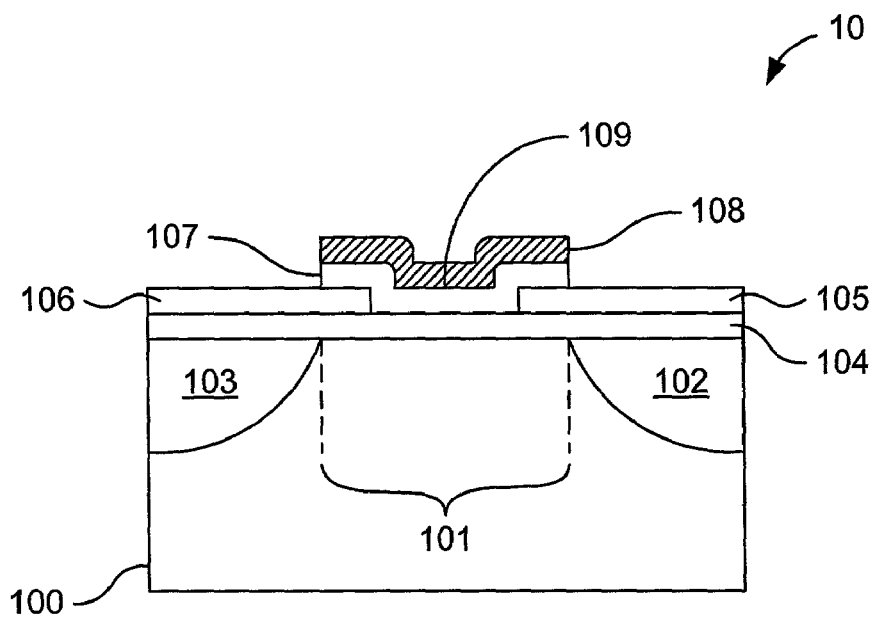
FIG. 1 is a simplified figurative depiction of a conventional MIOS memory cell.
Figure 2:
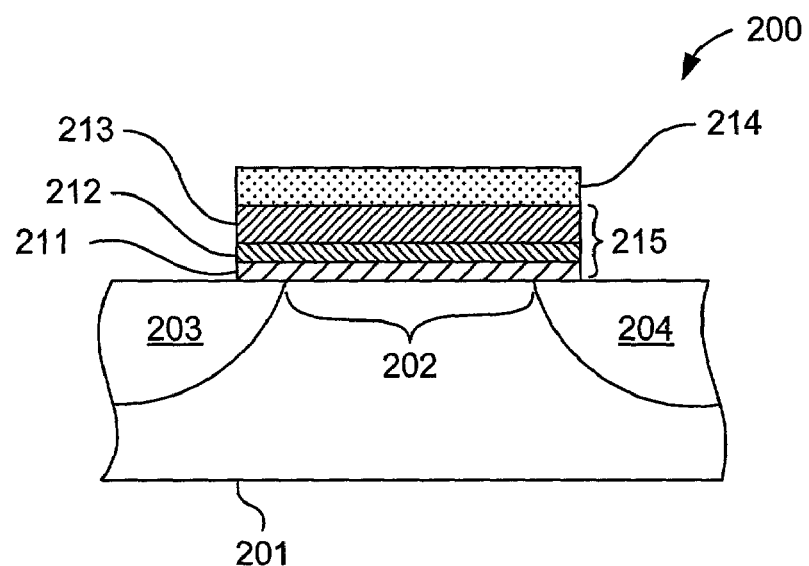
FIG. 2 is a simplified cross-sectional view of a memory device in accordance with the principles of the present invention.

FIG. 2 is an illustration depicting a portion of one embodiment of a memory structure 200 constructed in accordance with the principles of the present invention. The depicted embodiment includes a dielectric region formed on a semiconductor substrate. The dielectric region includes an electron affinity region sandwiched between the top portion of the dielectric region and the bottom portion of the dielectric region. A gate electrode is connected to the top portion of the dielectric region.

As depicted, the memory structure 200 includes a semiconductor substrate 201. Suitable substrates include, but are not limited to, silicon and gallium arsenide (GaAs) substrates. Such substrates can also include doped substrates. For example, the depicted embodiment is a p-doped silicon substrate 201 (n-doped or un-doped substrates can be used in other embodiments). The substrate 201 includes a channel region 202 positioned between a source 203 and a drain 204. In the depicted p-doped substrate 201, the source 203 and the drain 204 are typically n-doped.

A dielectric region 215 is formed over the channel region 202 of the substrate 201. In the case of a silicon substrate 201, silicon dioxide ($SiO_2$) is a particularly attractive material for the dielectric region 215 due to its relative ease of manufacture. However, silicon carbide, silicon oxynitride, silicon nitride (amorphous), zirconium dioxide, hafnium dioxide, and many other well known and commercially available dielectric materials may be used to form suitable dielectric layers. Additionally, many other dielectric materials known to persons having ordinary skill in the art may be used to form satisfactory dielectric regions.

A doped region 212 is formed in between a top portion 211 and a bottom portion 213 of the dielectric region 215. In alternative embodiments, the dielectric layer 215 can include more than one dielectric layer comprised of more than one dielectric material. A doped region 212 is formed by doping the dielectric layer 215 with suitable electron affinity materials. Such electron affinity materials are defined as materials that are stable in the dielectric material and, when incorporated into that dielectric material, exhibit an affinity for capturing electrons (i.e., have a suitable electron affinity when present in the dielectric material) and have one predominant valence state when present in the dielectric material. Electron affinity materials are considered stable in a dielectric material when they do not migrate from the dielectric material under operating conditions. Electron affinity materials are said to have suitable electron affinity when the electron affinity materials bind electrons with a certain strength when present in the dielectric material. For example, when it requires in the range of about 50 meV (millielectron volts) to about 3 eV (electron volts) to retain electrons in the doped region 212 the electron affinity material can be said to have a suitable electron affinity. In quantum calculations, the electron affinity of zirconium in a $SiO_2$ dielectric is on the order of about 1.0 eV. Yttrium has an electron affinity of about 0.3 eV in a $SiO_2$ dielectric. Also, by way of example, scandium has an electron affinity of about 0.7 eV in a $SiO_2$ dielectric. In another example, the electron affinity of zirconium in a $ZrO_2$ dielectric is on the order of about 0.4 eV. Thus, all the forgoing examples demonstrate sufficient electron affinity. Materials with relatively stronger electron affinities bind electrons more strongly in the doped region. Materials with relatively weaker electron affinities bind electrons less strongly in the doped region. These factors can be used to control some characteristics of memory cells formed in accordance with the principles of the present invention. For example, by using increased quantities of materials with a stronger electron affinity, a memory cell requires higher control gate voltages to erase memory. On the other hand, memory cells requiring lower control gate voltages to erase memory can be made by decreasing the quantity of electron affinity material or by using materials having weaker electron affinities. Thus, by choosing the amount and type of electron affinity material, the precise erase voltages can be reproducibly selected. This is a substantial advantage over existing MIOS memory cells.

Additionally, in order to obtain more predictable behavior in the memory cells certain electron affinity materials are favored. Normally, materials have many different oxidation states. However, in some materials, certain oxidation states predominate. Suitable electron affinity materials are those where a single valence state predominates when present in the dielectric layer. For example the predominate valence state of zirconium is four. Such predictability is desirable because it allows a doped region to be formed having a precise (and repeatable) electron affinity characteristics. Some suitable electron affinity elements include, but are not limited to scandium, yttrium, lanthanum, the lanthanides (cerium, praseodymium, neodymium, samarium, europium, gadolinium, terbium, dysprosium, holmium, erbium, thulium, ytterbium, and lutetium), zirconium, hafnium, niobium, and tantalum.

Figure 3A:
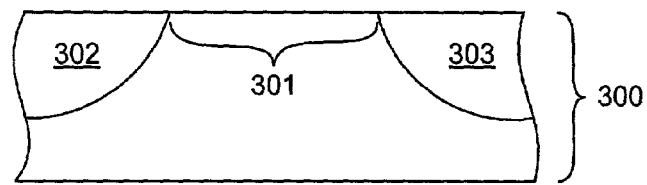
FIGS. 3(a)–3(e) are cross-sectional views of a portion of a semiconductor substrate showing aspects of one exemplary process and memory device embodiment in accordance with the principles of the present invention.

FIG. 3(a) shows a portion of a suitable semiconductor substrate 300 in readiness for processing in accordance with an embodiment of the present invention. FIG. 3(a) depicts a cross section view of a portion of a substrate 300 surface showing a channel region 301, a drain region 302, and a source region 303. Such structures can be formed by conventional processes known to those having ordinary skill in the art. Additionally, these substrates can be formed of many semiconductor materials known to those having ordinary skill in the art. Commonly used materials include, but are not limited to, silicon and GaAs materials. In the depicted embodiment, the substrate 300 is formed of silicon.

Figure 3B:
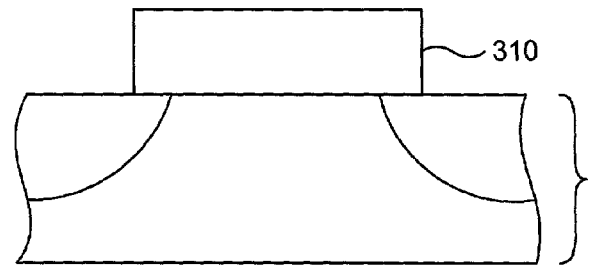

Referring to FIG. 3(b), a dielectric region 310 is formed on the substrate 300. This region 310 can be formed of many dielectric regions and using many processes. In one example, where the substrate 300 is formed of silicon, a dielectric region 310 comprised of $SiO_2$ can easily be formed. The $SiO_2$ can be thermally grown or formed by using a wide range deposition techniques. In the depicted embodiment the dielectric region 310 is formed using RTCVD (Rapid Thermal Chemical Vapor Deposition) to form a silicon dioxide ($SiO_2$) dielectric region 310. As was previously suggested, a wide range of other dielectric materials can be used to form the dielectric region 310. The dielectric region 310 is formed having a thickness in the range of about 5–1000 Å (angstroms). In one embodiment, a $SiO_2$ dielectric region of about 5–100 Å is used. In one preferred embodiment a $SiO_2$ dielectric region of about 100 Å thick is used. Although depicted here as being formed of a single dielectric material, the dielectric region 310 can be formed of layers of different dielectric materials.

Figure 3C:
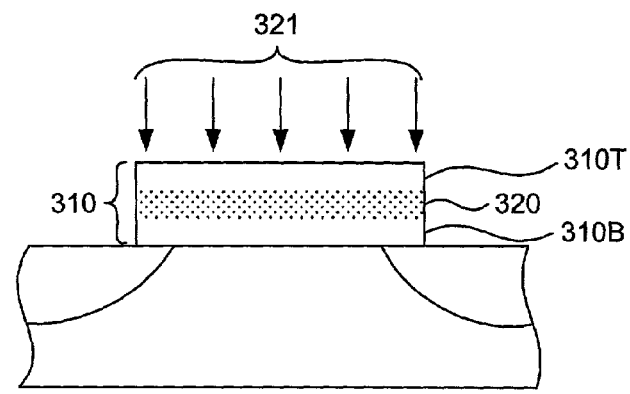

Referring to FIG. 3(c), a doped region 320 is formed in the dielectric region 310. This is accomplished by doping the dielectric region 310 with a suitable electron affinity material. As explained above, such materials can include, but are not limited to scandium, yttrium, lanthanum, the lanthanides, zirconium, hafnium, niobium, and associated hydrides of these materials. In the depicted embodiment the dielectric region 310 is doped with zirconium (Zr) ions. In the depicted embodiment, an electron affinity material is implanted into the dielectric region 310 to form doped region 320.

Still referring to the embodiment of FIG. 3(c), the electron affinity material is implanted 321 into the dielectric region 310 using an ion implantation device. Such implantation forms a doped region 320 containing the electron affinity material. This doped region 320 is sandwiched between a top portion 310T and a bottom portion 310B of the dielectric region 310. In one embodiment, Zr ions are implanted at about 800 eV into a 120 Å thick $SiO_2$ dielectric region 310. As depicted, a doped region 320, containing implanted material is formed. In the depicted embodiment the bottom portion 310B of dielectric region 310 is about 5–30 Å thick, preferably about 20 Å thick. Additionally, such implantation leaves a top portion 310T of dielectric region 310 of about 10–50 Å thick, preferably about 40 Å thick. A desirable doped region 320 has a thickness of between about 20–80 Å thick, preferably about 40 Å thick. Such a doped region 320 is implanted until the implanted ion density (ion dose) reaches a desired level. For example, using zirconium implanted into a $SiO_2$ dielectric region, an ion dose of about range of is on the order of $5 \times 10^{13}$ zirconium ion/$cm^2$ at energies in the range of about 0.2 keV to about 2 keV is satisfactory. In one preferred embodiment, an energy of 0.8 keV is used. This results in the bottom 20 Å of the dielectric region 310 (the bottom portion 310B) having an ion dose of about $1 \times 10^2$ zirconium ion/$cm^2$ which permits Fowler-Nordheim tunneling to occur in the bottom portion 310B of the dielectric region 310 without causing significant leakage pathways.

This structure can then be annealed to remove damage caused by the implantation. This can be achieved by rapid thermal annealing, for example, at about 700°–900° C. for about 10–30 s (seconds). In one preferred process, annealing occurs for about 30 s at about 700° C.

Figure 3D:
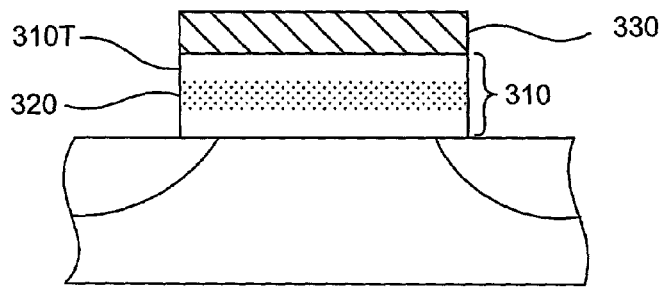
Figure 3E:
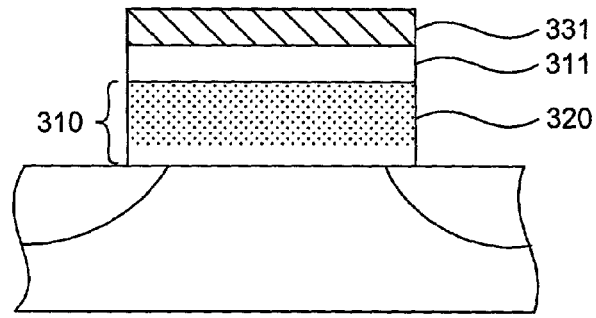

As shown in FIGS. 3(d) and 3(e), further processing can continue. In the embodiment of FIG. 3(d), a gate electrode 330 is then formed on the top portion 310T of the dielectric region 310. This gate electrode can then be electrically connected to other circuitry.

In an alternative embodiment shown in FIG. 3(e), the top portion 310T (of FIG. 3(d)) of the dielectric region 310 can be removed. This can be achieved using, for example, etching, CMP, or other suitable techniques. Once the top of the dielectric region 310 is removed, another layer of dielectric material 311 can be formed on top of the dielectric region 310. In the depicted embodiment, 20–50 Å of material are removed from the top of the dielectric region 310. Subsequently, another layer of dielectric material 311 is formed on the remaining portions of the dielectric region 310 using techniques known in the art. In some embodiments, the dielectric material of 310 and 311 are formed of the same dielectric material. In other embodiments, the dielectric region 310 and dielectric layer 311 are formed of different dielectric materials. After formation of dielectric layer 311, gate electrode 331 is formed on dielectric layer 311. This gate electrode can then be electrically connected to other circuitry.

Figure 4A:
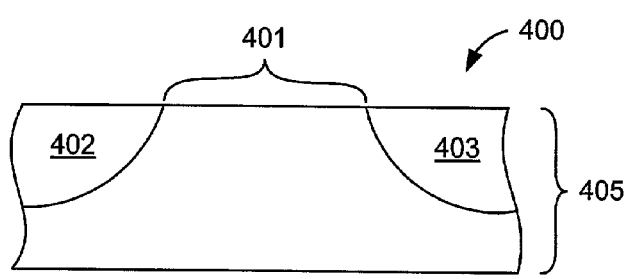
FIGS. 4(a)–4(e) are cross-sectional views of a portion of a semiconductor substrate showing aspects of another process and memory device embodiment in accordance with the principles of the present invention.

FIGS. 4(a)–4(d) depict yet another embodiment 400 in accordance with the principles of the present invention. FIG. 4(a) depicts a portion of a suitable semiconductor substrate 405 in readiness for processing in accordance with an embodiment of the present invention. The substrate shown in FIG. 4(a) is of the same type as discussed in FIG. 3(a). As depicted here, the substrate 405 is formed of silicon and includes a channel region 401, a drain region 402, and a source region 403.

Figure 4B:
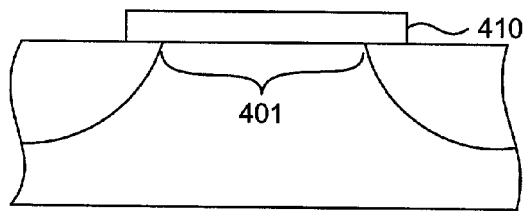

FIG. 4(b) depicts a first layer of dielectric material 410 formed over the channel region 401. As previously discussed, dielectric layer formation processes include the entire spectrum of deposition processes and thermal oxide growth. In the depicted embodiment, the first dielectric layer 410 is formed of $SiO_2$ using RTCVD. As previously discussed, the first dielectric layer 410 can be formed of many other dielectric materials formed using many processes. The depicted first dielectric layer 410 is has a thickness in the range of about 5–50 Å. For example, a thermally grown $SiO_2$ dielectric layer of about 20 Å is used.

Figure 4C:
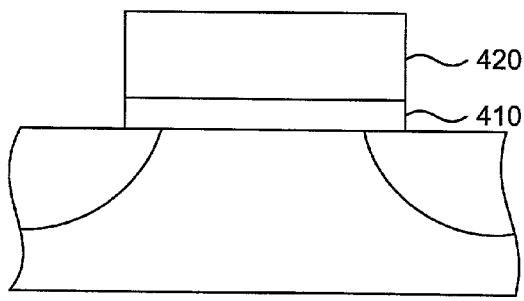

Referring to FIG. 4(c), a second layer of dielectric material 420 is formed on the first dielectric layer 410 (thus, a dielectric region comprising first layer 410 and second layer 420 is formed). As with the first dielectric layer 410, many dielectric materials can be used in the formation of the second dielectric layer 420. Such second dielectric layers can also be formed using a wide range of processes, as previously discussed. In the depicted embodiment, the second dielectric layer 420 is formed by depositing a layer of hafnium oxide ($HfO_2$) about 40–100 Å thick, preferably about 80 Å thick. Although many dielectric materials can be used, silicon dioxide (SiO$_2$), zirconium oxide (ZrO$_2$), and hafnium oxide are particularly suitable materials for second dielectric layer 420.

Figure 4D:
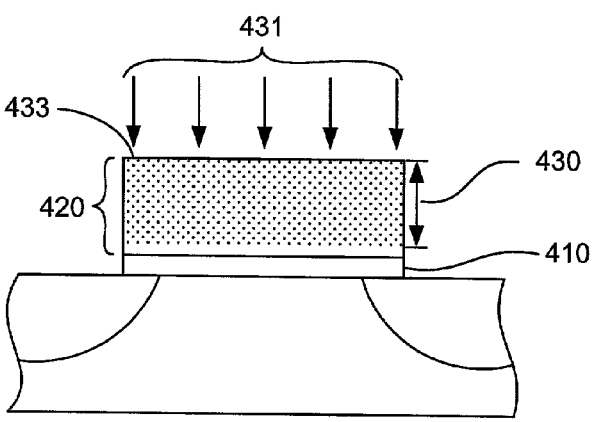

Referring to FIG. 4(d), a doped region 430 is formed in the second dielectric layer 420. This is accomplished by doping the second dielectric layer 420 with an electron affinity material (as described above). In the depicted embodiment, the second dielectric layer 420 is doped with zirconium (Zr) ions. Also as explained above, such doping can be achieved by implanting the electron affinity material into the second dielectric layer 420 to form the doped region 430. In the depicted embodiment, the zirconium electron affinity material is implanted 431 into the second dielectric layer 420. The doped region 430 can extend to the top portion 433 of the second dielectric layer 430 if desired. Implantation can be achieved using a variety of process conditions. In one example, Zr can be implanted into a HfO$_2$ second dielectric layer at about 800 eV. For example, a zirconium dose of about $1 \times 10^{15}$ Zr/cm$^2$ is implanted into the HfO$_2$ second dielectric layer. Additionally, under such conditions only a small portion of Zr ion penetrates into the first dielectric layer 410. In fact the total Zr dose in the first 20 Å of the dielectric layer 410 above the substrate 401 is on the order of $3 \times 10$ Zr/cm$^2$. Using HfO$_2$ to form the second dielectric layer 420 permits the creation of thinner doped regions 430 having reduced electron affinity as compared to the embodiment depicted in FIGS. 3(a)–3(e) (where the dielectric region was comprised of SiO$_2$ alone). Also, because the amount of Zr atoms penetrating into the first dielectric layer 410 and substrate 405 is nearly negligible, leakage pathways are very unlikely.

This structure can also be annealed to remove damage. This can be achieved, in one embodiment, by rapid thermal annealing at about 700°–900° C. for about 10–30 s. In one embodiment, annealing occurs for about 30 s at about 700° C.

Figure 4E:
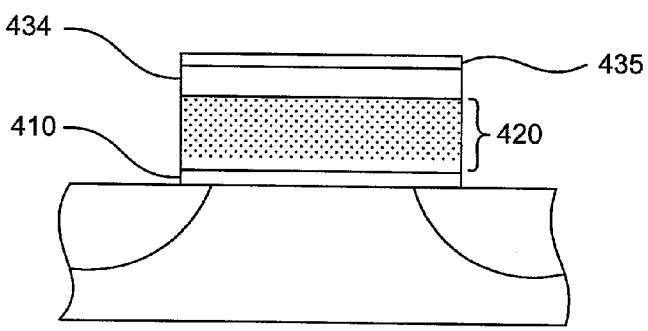

As with the other embodiments, the surface can then be subjected to further processing. For example, a gate electrode can be constructed on the top of the second dielectric layer structure. FIG. 4(e) depicts an alternative approach wherein the second dielectric layer 420 can have a portion of its top surface removed and a third dielectric layer 433 can then be formed on the second dielectric layer 420. Thereby forming a dielectric region having a first dielectric layer 410, a second dielectric layer 420, and a third dielectric layer 433. A gate electrode 435 can then be formed on the third dielectric layer 433. In one implementation, the first dielectric layer 410 is formed in the range of about 5 Å to about 50 Å thick. For example, a SiO$_2$ first layer about 20 Å thick. The second dielectric layer 420 is in the range of about 20 Å to about 80 Å thick. For example, a HfO$_2$ second layer about 60 Å thick. This second dielectric layer also contains the doped region. Finally, the third dielectric layer 433 is in the range of about 5 Å to about 50 Å thick. For example a SiO$_2$ third layer about 20 Å thick.

Figure 5A:
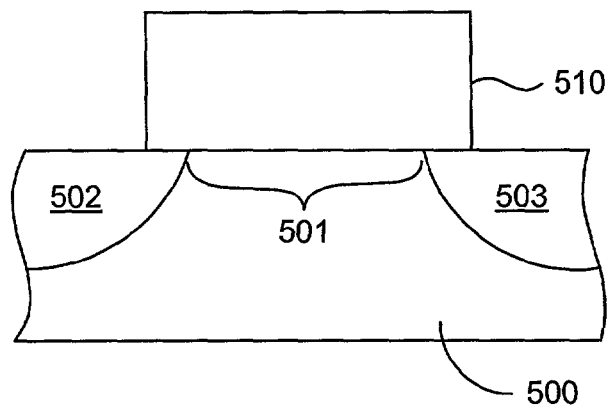
FIGS. 5(a)–5(c) are cross-sectional views of a portion of a semiconductor substrate showing aspects of yet another process and memory device embodiment in accordance with the principles of the present invention.
Figure 5B:
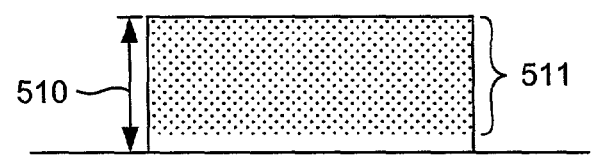
Figure 5C:
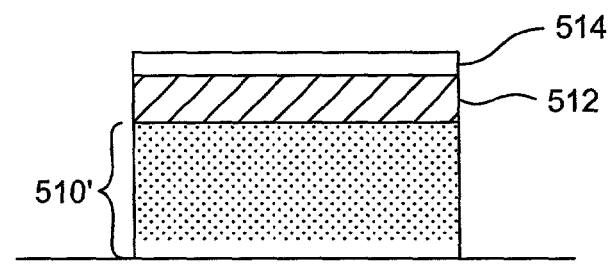

In accordance with another embodiment of the invention, the doped regions can be formed by plasma treating a dielectric region rather than using ion implantation. FIGS. 5(a)–5(c) depict a memory structure formed using plasma treatment of a dielectric region. FIG. 5(a) depicts a portion of a suitable semiconductor substrate 500 having a channel region 501, a drain region 502, and a source region 503. The depicted substrate 500 includes a dielectric region 510 formed over the channel region 501. The methods and materials used to form such structures have already been discussed (for example, with respect to FIGS. 3(a) and 3(b)). For example, in the depicted embodiment, the substrate 500 is formed of silicon with the dielectric region 510 comprised of SiO$_2$. In the depicted embodiment, the dielectric region 510 is formed having a thickness in the range of about 5–1000 Å. In one embodiment, a SiO$_2$ dielectric region of about 100 Å is used. As has been previously explained, other substrates and dielectric materials can be used.

In FIG. 5(b), a doped region 511 is formed in the dielectric region 510 by plasma treating dielectric region 510 in order to form a doped region 511 that includes a desired electron affinity material. As explained above, such materials can include, but are not limited to scandium, yttrium, lanthanum, the lanthanides, zirconium, hafnium, and niobium. Additionally, hydrides of the aforementioned electron affinity materials can be used to facilitate plasma treatment of the dielectric region 510.

The following discussion is directed toward a method embodiment for plasma treating a dielectric region to form a doped region. A substrate having a dielectric region formed thereon (such as that shown in FIG. 5(a)) is positioned inside an appropriate processing chamber. One example of a satisfactory machine is a LAM 9400SE machine. Once the substrate is positioned in the chamber, appropriate reactant materials are flowed into the chamber. For example zirconium hydride is flowed into the process chamber with an inert carrier gas (e.g., argon (Ar) or helium (He)). In one example, zirconium hydride is flowed into the chamber at a rate of about 25–150 SCCM (standard cubic centimeter per minute). One implementation uses a zirconium hydride flow rate of about 50 SCCM. As the electron affinity materials are flowed into the process chamber, a pressure in the range of about 1–100 mTorr, preferably about 10 mTorr is maintained. In one example, a transformer coupled plasma (TCP) process using power in the range of about 200 watts (W) to about 1000 W can be used. Continuing with the zirconium hydride example, a power of about 200 W RF (at 13.56 MHz) can be used. Additionally, the substrate can be biased at about 60 W RF (13.56). This should result in zirconium hydride ions (such as ZrH$_2^+$) having energies of about 50 eV. Where the dielectric region 510 is comprised of SiO$_2$, a suitable zirconium ion dose is in the range of about $10^{13}$ Zr/cm$^2$ to about $10^{15}$ Zr/cm$^2$, with a preferred dose of about $5 \times 10^{13}$ Zr/cm$^2$. After TCP treatment, a doped layer 511 can be formed to a desired depth in the dielectric region 510. Typical depths being dependent on the thickness of the dielectric 510. For example, if the dielectric 510 has a thickness of about 65 Å, then the doped layer 511 will only extend about 45 Å into the dielectric 510. This leaves an underlying untreated dielectric region of 20–30 Å thick. One typical process takes about 60 seconds to create a satisfactory doped layer 511. Although this example describes the doping of a SiO$_2$ dielectric region with zirconium electron affinity material, many different electron affinity materials can be plasma treated to appropriately form a doped region.

Because significantly lower energy is used to create the doped region 511, less damage is caused to the surface. This reduces the need for post-dope annealing. However, annealing can still be used to remove residual damage. For example, the surface can be annealed for about 30 s at about 700° C.

With reference to FIG. 5(c), processing continues by removing a top portion of the dielectric region 510. In its place, a second dielectric layer 512 can then be formed on the remaining portion 510' of the dielectric region. A gate electrode 514 can then be formed on the second dielectric layer 512. This procedure is discussed with respect to FIG. 3(e). It should also be noted that plasma treatment can be used in place of implantation to create doped regions in other processes. For example, referring to FIGS. 4(d) and 4(e), the second dielectric layer 420 can be doped using plasma treatment.

Figure 6:
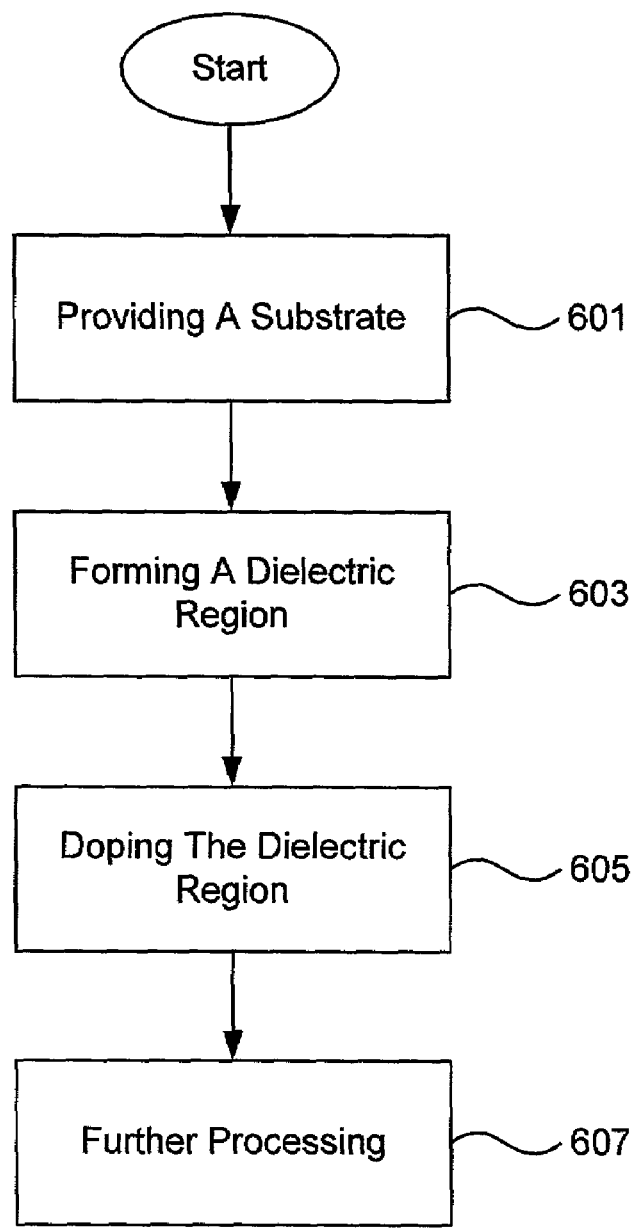
FIG. 6 is a flow diagram describing a suitable method embodiment for implementing a process for forming a memory cell in accordance with the principles of the present invention.

A generalized process flow for describing a method for forming memory cells in accordance with the principles of the present invention is illustrated in the flow diagram of FIG. 6. The method described in FIG. 6 begins by providing a substrate suitable for forming memory structures of the present invention thereon (Step 601). A dielectric region is then formed in the channel region of the substrate (Step 603). Methods and materials for forming such dielectric regions are well described hereinabove. The dielectric region is then doped with a suitable electron affinity material to form a doped region. (Step 605). Methods and materials for doping the dielectric regions are well described hereinabove. In particular, implantation or plasma treatment of the dielectric regions are suitable methods for forming the doped region. The structure is completed using further processing (Step 607). For example, a gate electrode can be connected to the top of the dielectric region. Alternatively, material can be removed from the top of the dielectric region and replaced with another layer of dielectric material which has a gate electrode attached thereto.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method for forming a memory device comprising:
    providing a suitable semiconductor substrate;
    forming a dielectric region over a channel region of the substrate;
    introducing an electron affinity material into the dielectric region to form a doped region between a top portion of the dielectric region and a bottom portion of the dielectric region wherein, said introducing includes
    implanting the dielectric region with a suitable electron affinity material to form the doped region in the dielectric region above a bottom portion of the dielectric region;
    removing the top portion of the dielectric region;
    forming a new top portion of the dielectric region over the doped region; and
    forming a gate electrode connected with the new top portion of the dielectric region.

2. A method for forming a memory device as in claim 1, wherein the step of implanting the dielectric region with a suitable electron affinity material is followed by annealing.

3. The method of claim 1 wherein the introducing of the electron affinity materials includes electron affinity materials that are stable in the dielectric region, have a suitable electron affinity when present in the dielectric region, and have one predominant valence state when present in the dielectric region.

4. The method of claim 1 wherein the electron affinity materials are selected from among the group of scandium, yttrium, lanthanum, the lanthanides, zirconium, hafnium, niobium, and tantalum.

5. The method of claim 1 wherein the top portion of the dielectric region and the new top portion of the dielectric region are each comprised of different dielectric materials.

6. The method of claim 1 wherein the electron affinity materials are selected from among the group of scandium, yttrium, lanthanum, the lanthanides, zirconium, hafnium, and niobium.

7. A method for forming a memory device comprising:
    providing a suitable semiconductor substrate;
    forming a dielectric region over a channel region of the substrate;
    forming a doped region with electron affinity materials in the dielectric region;
    removing a top portion of the dielectric region;
    forming a top dielectric layer over the dielectric region; and
    forming a gate electrode connected with the top dielectric layer.

8. A method for forming a memory device as in claim 7, wherein forming the doped region includes plasma treating the dielectric region with a plasma containing suitable electron affinity materials to form the doped region in the dielectric region.

9. A method for forming a memory device as in claim 8 wherein the dielectric region and the top dielectric layer are each comprised of the same dielectric material.

10. A method for forming a memory device as in claim 7 wherein the step of
    forming a dielectric region over the channel region of the substrate includes
        forming a first dielectric layer over the channel region and
        forming a second dielectric layer over the first dielectric layer;
    wherein the step of forming a doped region in the dielectric region includes plasma treating the second dielectric layer with a plasma containing suitable electron affinity materials to form the doped region in the second dielectric layer;
    wherein the step of removing the top portion of the dielectric region includes removing a top portion of the second dielectric layer, leaving a remaining portion of the second dielectric layer;
    wherein the step of forming the top dielectric layer includes forming a third dielectric layer over the remaining portion of the second dielectric layer; and
    wherein the step of forming the gate electrode includes forming the gate electrode connected with the third dielectric layer.

11. The method of claim 7 further including annealing the doped dielectric region.

12. The method of claim 7 wherein forming the doped region with electron affinity materials includes forming the doped region with electron affinity materials that are stable in the dielectric region, have a suitable electron affinity when present in the dielectric region, and have one predominant valence state when present in the dielectric region.

13. The method of claim 7 wherein forming the doped region with electron affinity materials includes forming the doped region with electron affinity materials that are selected from among the group of scandium, yttrium, lanthanum, the lanthanides, zirconium, hafnium, niobium, and tantalum.

14. A method for forming a memory device as in claim 7 wherein the dielectric region and the top dielectric layer are each comprised of different dielectric materials.

15. The method of claim 7 wherein forming the doped region with electron affinity materials includes forming the doped region with electron affinity materials that are selected from among the group of scandium, yttrium, the lanthanides, zirconium, hafnium, and niobium.

* * * * *